United States Patent
Shirata

(10) Patent No.: US 6,550,038 B2
(45) Date of Patent: Apr. 15, 2003

(54) SEMICONDUCTOR INTEGRATED CIRCUITRY

(75) Inventor: Shuuichi Shirata, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 36 days.

(21) Appl. No.: 09/814,868

(22) Filed: Mar. 23, 2001

(65) Prior Publication Data

US 2002/0046388 A1 Apr. 18, 2002

(30) Foreign Application Priority Data

Oct. 17, 2000 (JP) ........................................ 2000-316684

(51) Int. Cl.$^7$ ................................................ G05F 1/56
(52) U.S. Cl. ........................... 716/4; 365/227; 324/537; 714/733
(58) Field of Search ................................. 716/4; 324/537, 324/763, 765, 713, 771; 365/226, 227; 714/30, 733, 734, 724

(56) References Cited

U.S. PATENT DOCUMENTS 4,833,341 A * 5/1989 Watanabe et al. ............ 323/311
6,072,742 A * 6/2000 Ooishi .................... 365/189.07
6,297,624 B1 * 10/2001 Mitsui et al. ................ 323/314

FOREIGN PATENT DOCUMENTS

| JP | 62-232155 | 10/1987 |
| JP | 04-274504 | 9/1992 |
| JP | 10-303371 | 11/1998 |

* cited by examiner

Primary Examiner—Tuan T. Lam
Assistant Examiner—Linh Nguyen
(74) Attorney, Agent, or Firm—Burns, Doane, Swecker & Mathis, LLP

(57) ABSTRACT

Semiconductor integrated circuitry comprises an I/O circuit for activating an input/output of an internal circuit in response to an external power supply voltage applied thereto, a reference voltage generation circuit for decreasing the external power supply voltage so as to generate a constant reference voltage, a voltage drop circuit for controlling the external power supply voltage so as to decrease it such that it is equal to an input voltage applied thereto, and for supplying the decreased external power supply voltage to the internal circuit, and a mode determination control circuit to which a power supply voltage for test is supplied from a power supply for test that is connected to a power supply terminal for test in test mode, for comparing the power supply voltage for test with a threshold voltage so as to determine whether the semiconductor integrated circuitry is placed in either normal operation mode or the test mode, and for supplying either the reference voltage or the power supply voltage for test to the voltage drop circuit as the input voltage according to the mode determination result.

6 Claims, 7 Drawing Sheets

FIG.4
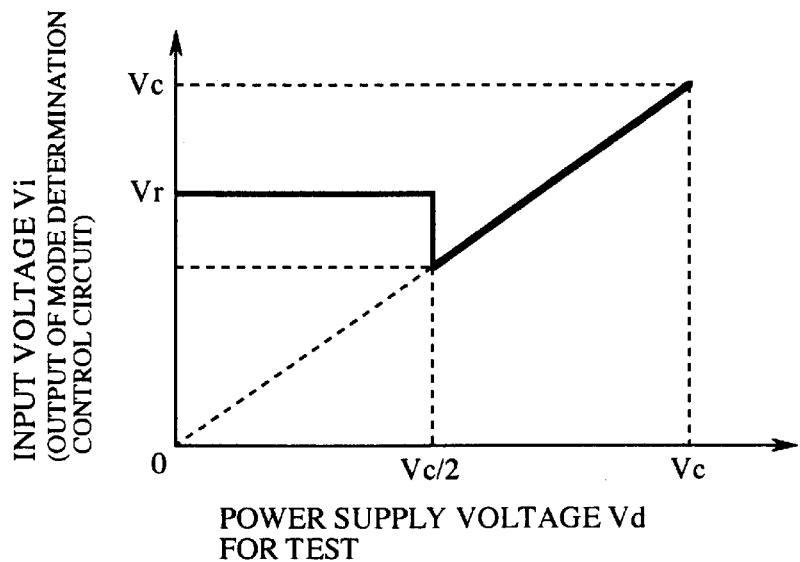
FIG.5A
FIG.5B
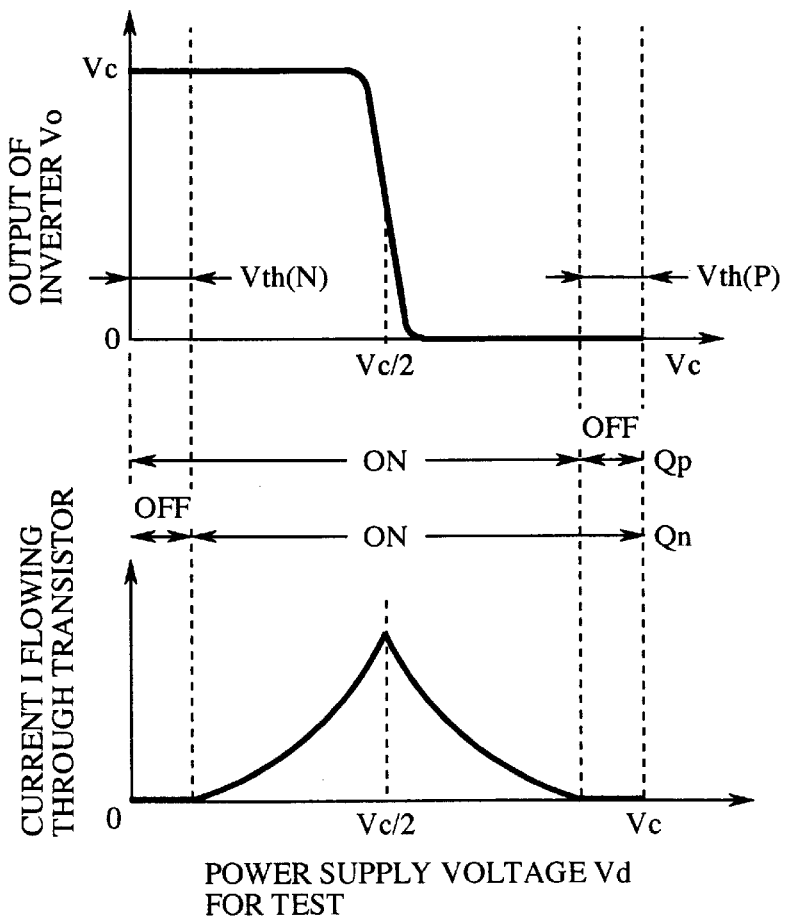

FIG.6
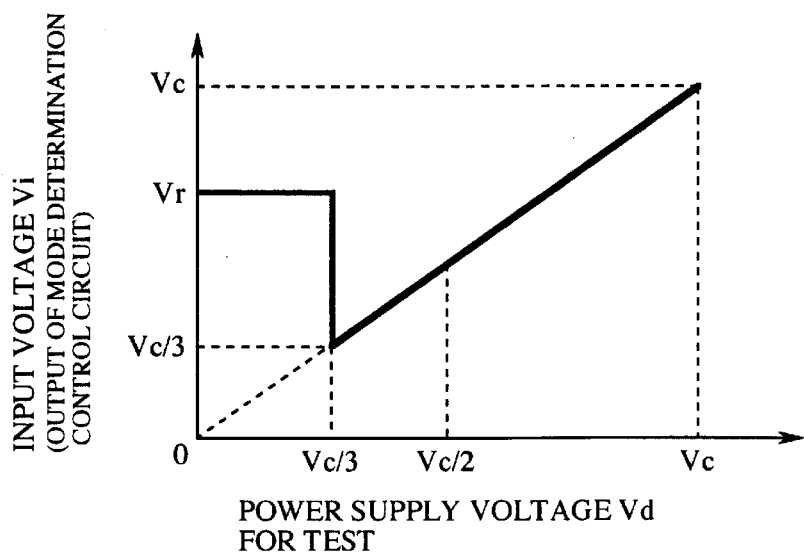
FIG.7A
FIG.7B
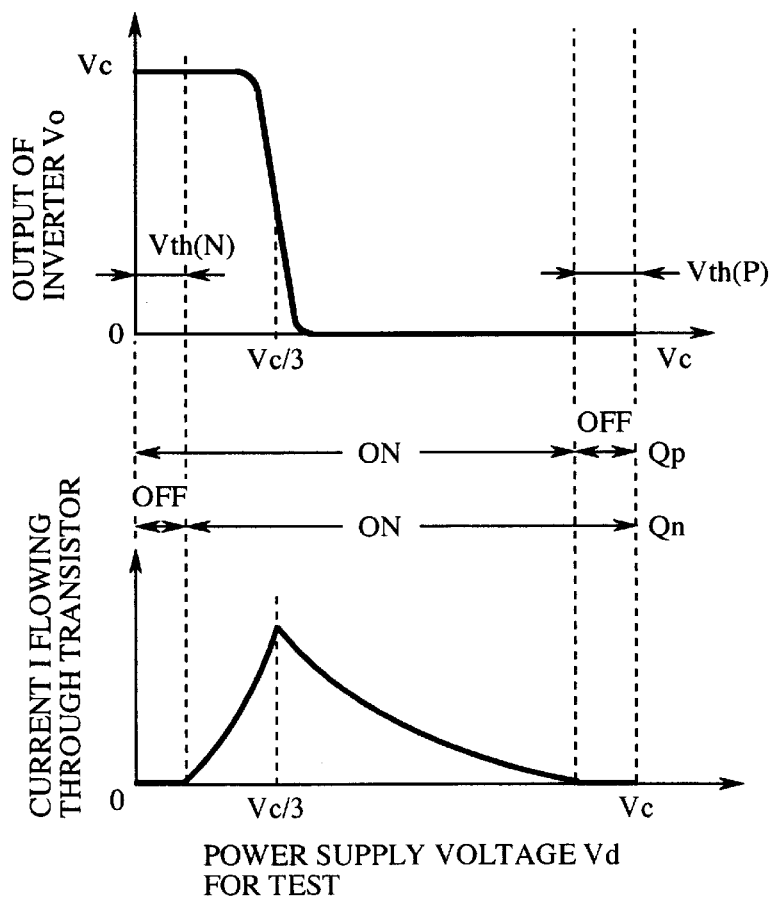

SEMICONDUCTOR INTEGRATED CIRCUITRY

BACKGROUND OF THE INVENTION

1. Field of the Invention

The present invention relates to semiconductor integrated circuitry that enables a mode selection and an evaluation of the operation limit of an internal circuit only by applying a power supply voltage for test to the semiconductor integrated circuitry in test mode.

2. Description of the Prior Art

It is necessary to judge whether semiconductor integrated circuitry is defective or not prior to shipment. A high-temperature running test carried out on products continuously running at a high temperature during a fixed time interval is known as a test made to exclude early failures, for example. Such a high-temperature running test is called a burn-in test. For example, when semiconductor integrated circuitry, which is a product to be tested, is a single-chip microcomputer, the microcomputer to be tested is connected to a driver circuit by way of a data bus signal line, an address signal line and a control signal line, and the burn-in test is carried out in such a manner that a power supply voltage for test of about 7.0 Volts which is higher than a normal power supply voltage (4.5 to 5.5 Volts) applied to the microcomputer under normal operating conditions is applied to the microcomputer at a high temperature which exceeds 100° C. and the microcomputer is made to operate continuously during a fixed time interval.

FIG. 12 is a schematic circuit diagram showing the structure of an example of prior art semiconductor integrated circuitry. In the figure, reference numeral 1 denotes the semiconductor integrated circuitry which is a single-chip microcomputer, numeral 2 denotes an internal circuit which is an integrated circuit including a logic circuit etc., numeral 3 denotes an I/O circuit including an input/output terminal 3a and an output buffer 3 b for connecting the internal circuit 2 to an external circuit (not shown in the figure), numeral 4 denotes a voltage drop control (VDC) circuit that consists of a reference voltage generation circuit 4a and a voltage drop circuit 4b, numeral 5 denotes a power supply switch circuit for selecting either an external power supply or a power supply for test and for connecting the selected power supply to the internal circuit 2, numeral 6 denotes an external power supply terminal via which the external power supply is supplied to the semiconductor integrated circuitry 1, numeral 7 denotes a power supply terminal for test via which the power supply for test is supplied to the semiconductor integrated circuitry 1 in the test mode, and numeral 8 denotes a power supply control terminal for controlling the power supply switch circuit 5 so that the power supply switch circuit 5 switches between the two selection modes.

In operation, when the semiconductor integrated circuitry 1 is actually used as a product, that is, when the semiconductor integrated circuitry 1 operates in the normal operation mode, the semiconductor integrated circuitry 1 is used in a state in which the power supply for test is not connected to the power supply terminal 7 for test while the external power supply (not shown in the figure) is connected to the external power supply terminal 6. In this case, the external power supply voltage Vc is supplied to the I/O circuit 3 and the voltage drop control circuit 4. The reference voltage generation circuit 4a included in the voltage drop control circuit 4 consists of a plurality of diodes (not shown in the figure) in series, for example, and the sum of the forward voltage drops by the individual diodes is furnished as a reference voltage Vr to the voltage drop circuit 4b. If the external power supply voltage Vc is 5 Volts, this reference voltages Vr is set to be about 4 Volts which is slightly lower than the external power supply voltage and is then supplied as a target dropped voltage to the voltage drop circuit 4b which is the next stage of the voltage drop control circuit 4. The voltage drop circuit 4b controls the external power supply voltage Vc so as to decrease the external power supply voltage Vc to the reference voltage Vr, and supplies the decreased external power supply voltage to the power supply switch circuit 5. In the normal operation mode, the power supply switch circuit 5 is in the state of connecting the voltage drop circuit 4b to the internal circuit 2, and, therefore, the output voltage of the voltage drop circuit 4b is supplied to the internal circuit 2 by way of the power supply switch circuit 5. In this case, although an influence of any change in the external power supply voltage Vc is exerted on the I/O circuit 3, the internal circuit 2 can be made to operate with stability without independently of any change in the external power supply voltage Vc because the voltage drop circuit 4b controls the external power supply voltage Vc so as to decrease the external power supply voltage Vc to the reference voltage Vr.

On the other hand, in the test mode for an evaluation of the operation limit of the internal circuit 2, the power supply (not shown in the figure) for test is connected to the power supply terminal 7 for test, and a switch instruction is furnished by way of the power supply control terminal 8 to the power supply switch circuit 5. As a result, since the internal circuit 2 is connected to the power supply for test by way of the power supply terminal 7 for test and the I/O circuit 3 is connected to the external power supply by way of the external power supply terminal 6, two kinds of tests: an internal circuit test and an I/O circuit test can be carried out. When carrying out the internal circuit test, only the power supply voltage Vd for test to be applied to the internal circuit 2 is changed without changing the external power supply voltage Vc to be applied to the I/O circuit 3. As a result, whether the internal circuit 2 can handle any change in the power supply voltage for test while having a margin up to which extent for the voltage change is tested, and an evaluation of the operation limit of the internal circuit 2 can thus be made. On the other hand, when carrying out the I/O circuit test, only the external power supply voltage Vc to be applied to the I/O circuit 3 is changed without changing the power supply voltage Vd for test to be applied to the internal circuit 2. As a result, whether the I/O circuit 3 can handle any change in the external power supply voltage while having a margin up to which extent for the voltage change is tested, and an evaluation of the operation limit of the I/O circuit 3 can thus be made.

A problem with the prior art semiconductor integrated circuitry 1 constructed as above is that the power supply switch circuit 5 and the two terminals: the power supply terminal 7 for test and the power supply control terminal 8 are indispensable to make an evaluation of the operation limit of the internal circuit, and the circuit structure is therefore complicated. Another problem with the prior art semiconductor integrated circuitry 1 is that since a connecting line having a capacity of large current is needed as a feedline for connecting the power supply terminal 7 for test to the power supply switch circuit 5, the large-current connecting line can interfere with an improvement of the packaging density on a circuit board on which the internal circuit 2 is mounted.

SUMMARY OF THE INVENTION

The present invention is proposed to solve the above-mentioned problems, and it is therefore an object of the present invention to provide semiconductor integrated circuitry that enables a mode selection and an evaluation of the operation limit of an internal circuit only by applying a power supply voltage for test to the semiconductor integrated circuitry in the test mode.

In accordance with the present invention, there is provided semiconductor integrated circuitry comprising: an internal circuit that is an semiconductor integrated circuit; an I/O circuit for activating an input/output of the internal circuit in response to an external power supply voltage applied thereto; a reference voltage generation circuit for decreasing the external power supply voltage so as to generate a constant reference voltage; a voltage drop circuit for controlling the external power supply voltage so as to decrease it such that it is equal to an input voltage applied thereto, and for supplying the decreased external power supply voltage to the internal circuit; and a mode determination control circuit to which a power supply voltage for test is supplied from a power supply for test that is connected to a power supply terminal for test in test mode, for comparing the power supply voltage for test with a threshold voltage so as to determine whether the semiconductor integrated circuitry is placed in either normal operation mode or the test mode, and for supplying either the reference voltage or the power supply voltage for test to the voltage drop circuit as the input voltage according to the mode determination result.

In accordance with a preferred embodiment of the present invention, the mode determination control circuit includes a mode determination unit having a pair of inverters in series having an input terminal for receiving the power supply voltage for test, and a switching unit having a pair of transmission gates, for selectively supplying either the reference voltage or the power supply voltage for test to the voltage drop circuit, the pair of transmission gates having output terminals connected in common to the voltage drop circuit, one of the transmission gates having an input terminal connected to the power supply terminal for test and the other transmission gate having an input terminal connected to the reference voltage generation circuit, and only one of the pair of transmission gates being switched to its conducting state in response to two outputs of the inverters included in the inverter pair. Preferably, a first-stage one of the pair of inverters inverts its output voltage based on a logical threshold voltage that is equal to or less than one-half of the external power supply voltage.

In accordance with another preferred embodiment of the present invention, the mode determination control circuit includes a mode determination unit having three inverters in series having an input terminal for receiving the power supply voltage for test, and a switching unit having a pair of transmission gates, for selectively supplying either the reference voltage or the power supply voltage for test to the voltage drop circuit, the pair of transmission gates having output terminals connected in common to the voltage drop circuit, one of the transmission gates having an input terminal connected to the power supply terminal for test and the other transmission gate having an input terminal connected to the reference voltage generation circuit, and only one of the pair of transmission gates being switched to its conducting state in response to two outputs of two of the three inverters in series other than a first-stage one of them. Preferably, a first-stage one of the three inverters in series inverts its output voltage based on a logical threshold voltage that is equal to or greater than one-half of the external power supply voltage.

In accordance with another preferred embodiment of the present invention, the mode determination control circuit includes a resistor located on a line for connecting the reference voltage generation circuit to the voltage drop circuit, and a power supply voltage supply line for test for supplying the power supply voltage for test to a node located between the resistor and the voltage drop circuit.

Further objects and advantages of the present invention will be apparent from the following description of the preferred embodiments of the invention as illustrated in the accompanying drawings.

BRIEF DESCRIPTION OF THE DRAWINGS

FIG. 4 is a graph showing an I/O voltage characteristic of the mode determination control circuit shown in FIG. 1;

FIGS. 5(A) and 5(B) are graphs showing operation characteristics of the inverter shown in FIG. 3;

FIG. 6 is a graph showing an I/O voltage characteristic of a mode determination control circuit of semiconductor integrated circuitry according to a second embodiment of the present invention;

FIGS. 7(A) and 7(B) are graphs showing operation characteristics of an inverter included in the mode determination control circuit of the semiconductor integrated circuitry according to the second embodiment of the present invention;

DETAILED DESCRIPTION OF THE PREFERRED EMBODIMENTS

Embodiment 1

Figure 1:
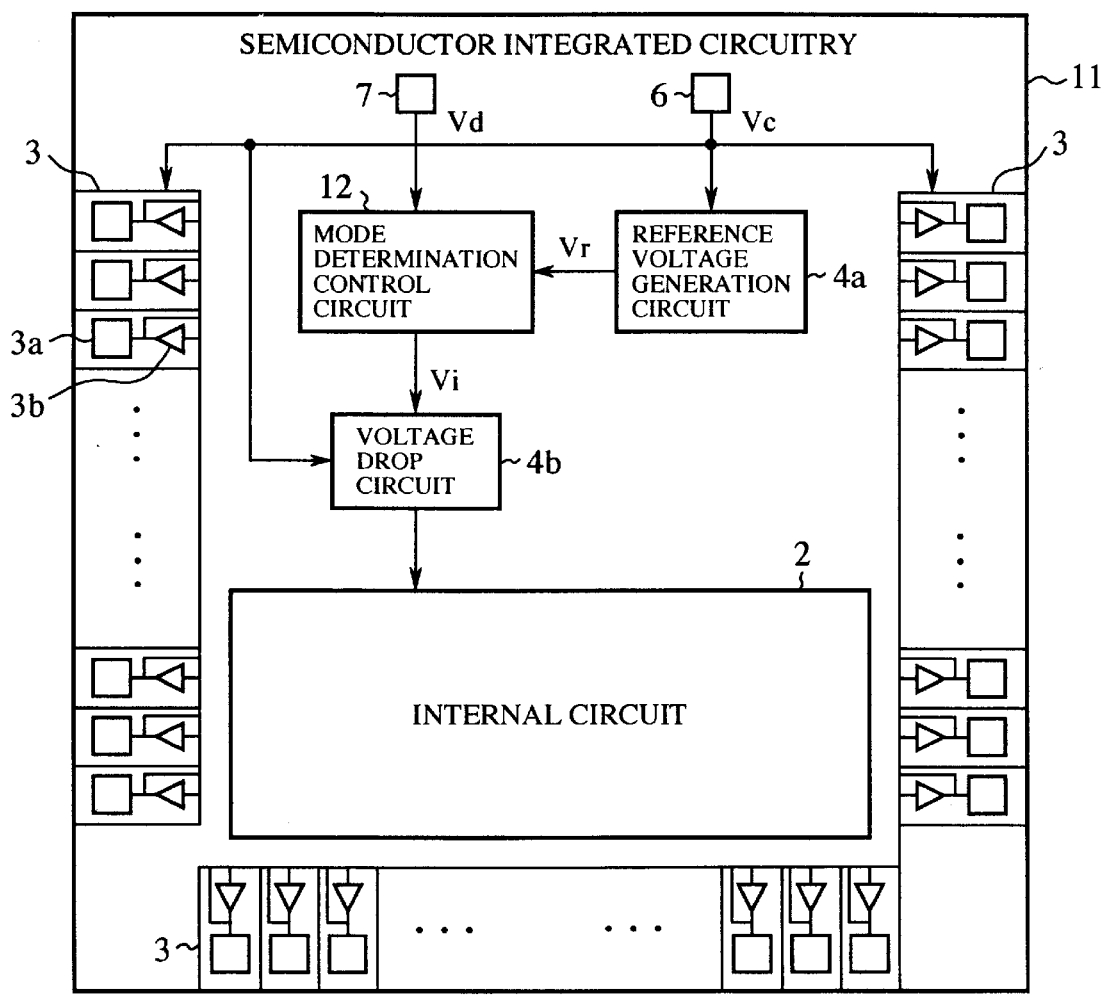
FIG. 1 is a schematic circuit diagram showing the structure of semiconductor integrated circuitry according to a first embodiment of the present invention.
Figure 12:
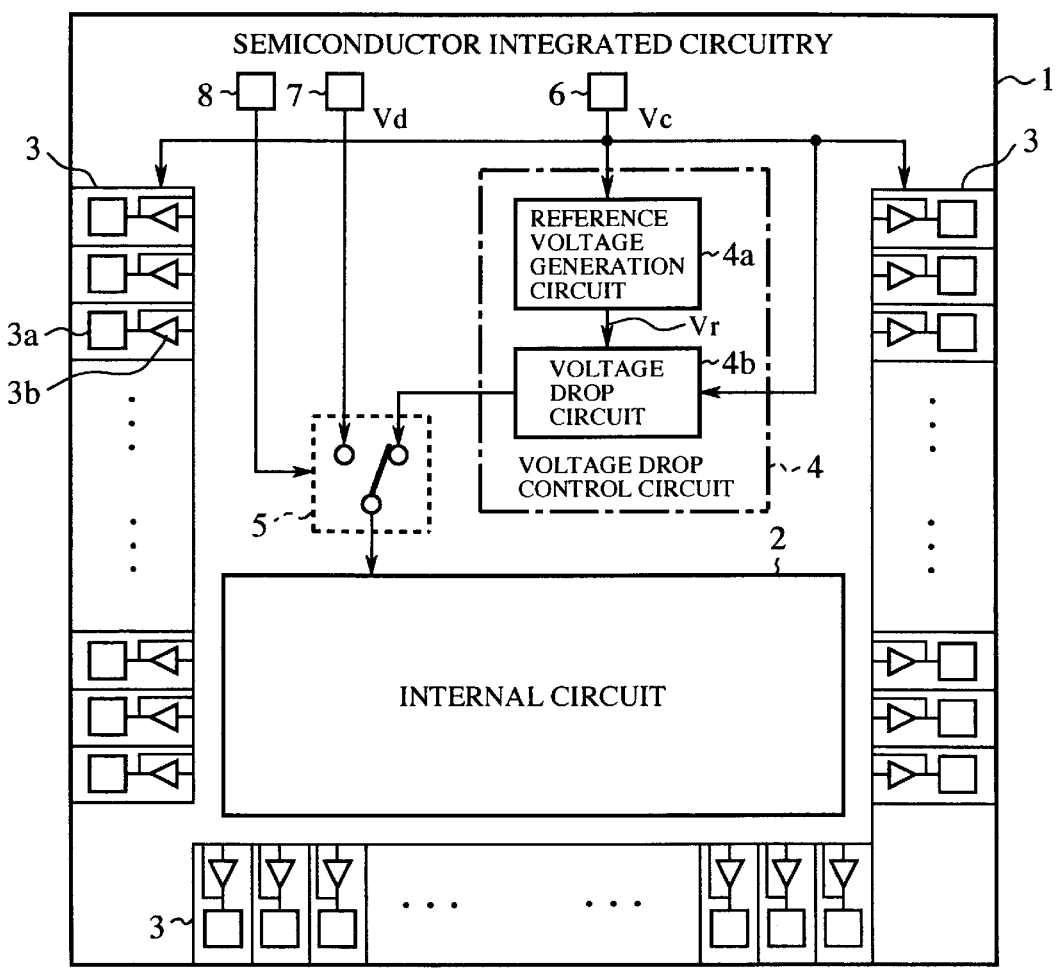
FIG. 12 is a schematic circuit diagram showing the structure of an example of prior art semiconductor integrated circuitry.

FIG. 1 is a schematic circuit diagram showing the structure of semiconductor integrated circuitry according to a first embodiment of the present invention. The same components as shown in FIG. 12 are designated by the same reference numerals, and therefore the description of those components will be omitted hereafter. In FIG. 1, reference numeral 11 denotes the semiconductor integrated circuitry according to the first embodiment of the present invention, such as a single-chip microcomputer, and numeral 12 denotes a mode determination control circuit. The mode determination control circuit 12 is located between a reference voltage generation circuit 4a and a voltage drop circuit 4b. A power supply voltage Vd for test is supplied to the mode determination control circuit 12 from a power supply (not shown in the figure) for test connected to a power supply terminal 7 for test in the test mode. The mode determination control circuit 12 determines whether the power supply voltage Vd for test is greater than a threshold voltage or not so as to determine whether the semiconductor integrated circuitry is placed in the normal operation mode or the test mode. The mode determination control circuit 12 then supplies either a reference voltage Vr or the power supply voltage Vd for test to the voltage drop circuit 4b as an input voltage Vi according to the mode determination result. The voltage drop circuit 4b controls an external power supply voltage Vc applied thereto via an external power supply terminal 6 so as to decrease the external power supply voltage to the input voltage Vi.

Figure 2:
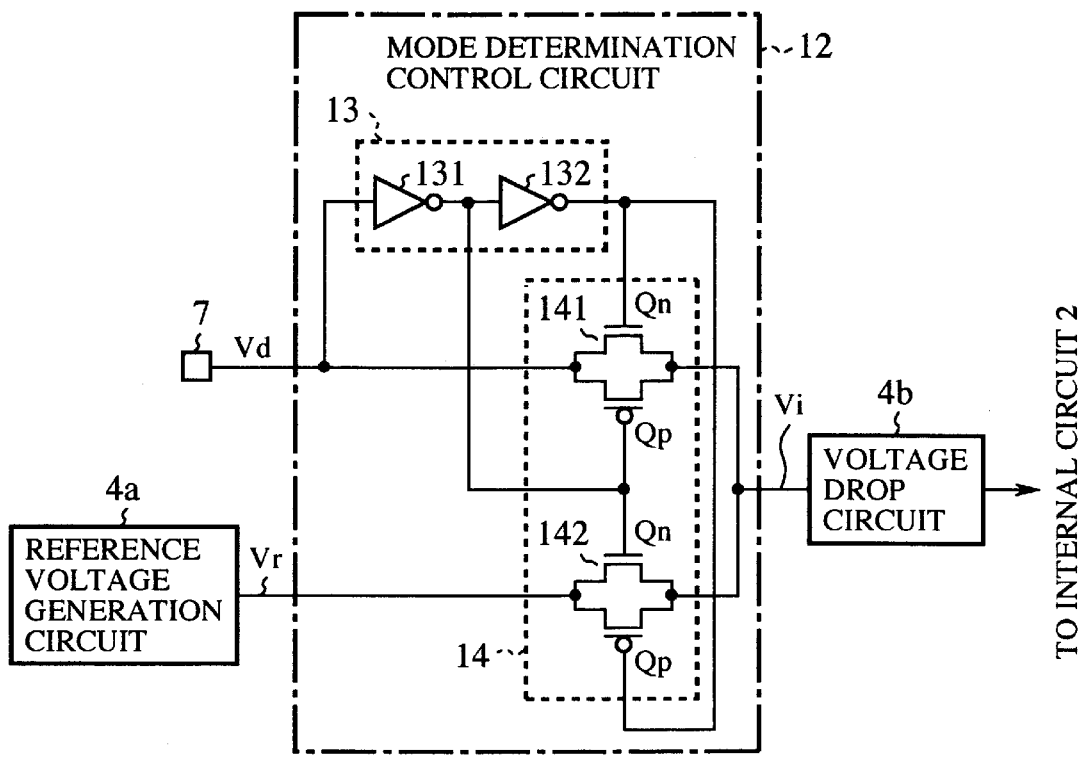
FIG. 2 is a schematic circuit diagram showing a main part of the semiconductor integrated circuitry shown in FIG. 1.

FIG. 2 is a schematic circuit diagram showing a main part of the semiconductor integrated circuitry 11 shown in FIG. 1. The mode determination control circuit 12 shown in FIG. 2 includes a mode determination unit 13 and a switching unit 14. The mode determination unit 13 includes a pair of inverters 131 and 132 in series. The switching unit 14 includes a pair of transmission gates 141 and 142 whose output terminals are connected in common to the voltage drop circuit 4b, the transmission gate 141 having an input terminal connected to the power supply terminal 7 for test and the other transmission gate 142 having an input terminal connected to the reference voltage generation circuit 4a. The pair of transmission gates 141 and 142 receives the outputs of the pair of inverters 131 and 132 via their gates. Those transmission gates 141 and 142 operate in a way opposite to each other. In other words, when the transmission gate 141 is switched from its conducting state to its nonconducting state, the other transmission gate 142 is switched from its nonconducting state to its conducting state. And, when the transmission gate 141 is switched from its nonconducting state to its conducting state, the other transmission gate 142 is switched from its conducting state to its nonconducting state. The pair of transmission gates 141 and 142 thus supplies either the reference voltage Vr or the power supply voltage Vd for test to the voltage drop circuit 4b as the input voltage Vi.

Figure 3:
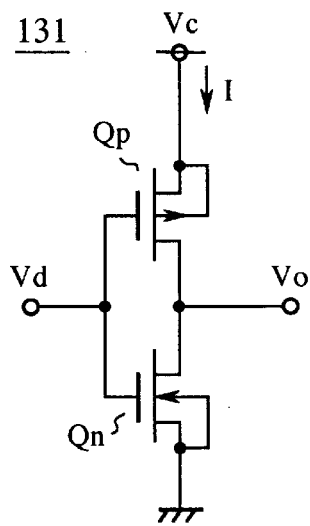
FIG. 3 is a schematic circuit diagram showing a concrete example of an inverter included in a mode determination control circuit shown in FIG. 1.

FIG. 3 is a schematic circuit diagram showing a concrete example of the inverter 131 shown in FIG. 1. The inverter 131 shown in FIG. 3 is a first-stage inverter of the mode determination unit 13. The other inverter 132 that is the next stage of the mode determination unit 13 has the same structure. The first-stage inverter 131 includes a P-channel transistor Qp having a source connected to the external power supply terminal 6, and an N-channel transistor Qn having a source grounded. The gates of these transistors are connected in common to an input terminal of the first-stage inverter, and the drains of the transistors are connected in common to an output terminal of the first-stage inverter. The P-channel transistor Qp has driving efficiency which is almost equivalent to that of the N-channel transistor Qn. The first-stage inverter 131 performs an inversion operation based on its logical threshold voltage which is almost equal to one-half of the external power supply voltage Vc. As well known, the polarity of a voltage applied between the gate and source of the P-channel transistor Qp is opposite to that of the N-channel transistor Qn. The P-channel transistor Qp is brought into conduction when the voltage applied between the gate and source of the P-channel transistor Qp exceeds a gate-source voltage that causes an electric current to begin to flow through the P-channel transistor Qp, i.e., a threshold voltage Vth(P). Similarly, the N-channel transistor Qn is brought into conduction when the voltage applied between the gate and source of the N-channel transistor Qn exceeds a gate-source voltage that causes an electric current to begin to flow through the N-channel transistor Qn, i.e., a threshold voltage Vth(N). Therefore, by making the absolute value of the driving efficiency of the P-channel transistor Qp almost equal to that of the N-channel transistor Qn, the driving efficiency of each transistor being represented by the rate of a change of the electric current I to a change of the gate voltage after each transistor is brought into conduction, the first-stage inverter 131 can be designed to have a threshold voltage of Vc/2 in such a manner that through the application of the threshold voltage the electric current I flowing through the P-channel transistor Qp which is measured as the gate voltage (in this case, the power supply voltage Vd for test) is increased is equal to the electric current I flowing through the N-channel transistor Qn which is measured as the gate voltage is decreased. In FIG. 3, Vo is an output voltage of the first-stage inverter 131.

Each of the transmission gates 141 and 142 is constructed of a pair of a P-channel transistor Qp and an N-channel transistor Qn, like the above-mentioned first-stage inverter 131. As can be seen from FIG. 2, the two transistors Qp and Qn of each of the transmission gates 141 and 142 have sources connected to each other and drains connected to each other. Each of the transmission gates 141 and 142 can be switched between its conducting state and its nonconducting state by applying two voltages with different polarities to its gate terminals. The transmission gate 141 has an input terminal connected to the power supply terminal 7 for test. The output of the first-stage inverter 131 is supplied to the gate of the P-channel transistor Qp of the first transmission gate 141, and the output of the next-stage inverter 132 is supplied to the gate of the N-channel transistor Qn of the first transmission gate141. The other transmission gate 142 has an input terminal connected to the reference voltage generation circuit 4a. The output of the first-stage inverter 131 is supplied to the gate of the N-channel transistor Qn of the second transmission gate 142, and the output of the next-stage inverter 132 is supplied to the gate of the P-channel transistor Qp of the second transmission gate 142. The transmission gates 141 and 142 have output terminals connected in common to the voltage drop circuit 4b, respectively.

FIG. 4 is a graph showing an input voltage-output voltage characteristic of the mode determination control circuit shown in FIG. 1. FIGS. 5(A) and 5(B) are graphs showing operation characteristics of the first-stage inverter shown in FIG. 3. In the normal operation mode, the power supply for test is not connected to the power supply terminal 7 for test, and no voltage is therefore applied to the power supply terminal 7 for test. Therefore, as can be seen from FIGS. 5(A) and 5(B), the output of the first-stage inverter 131 is at a High level, and the output of the next-stage inverter 132 is at a Low level. As a result, the first transmission gate 141 whose input terminal is connected to the power supply terminal 7 for test is switched to its nonconducting state, and the second transmission gate 142 whose input terminal is connected to the reference voltage generation circuit 4 is switched to its conducting state. Thus, the reference voltage Vr generated by the reference voltage generation circuit 4a is supplied to the voltage drop circuit 4b by way of the second transmission gate 142. The voltage drop circuit 4b thus controls the external power supply voltage Vc so as to decrease it with the aim of making it equal to the reference voltage Vr, and supplies the decreased external power supply voltage to the internal circuit 2 as the input voltage Vi. In this case, although the I/O circuit 3 activated by the supply of the external power supply voltage Vc is influenced by a change in the external power supply voltage Vc, the internal circuit 2 is made to operate with stability independently of any change in the external power supply voltage Vc because the voltage drop circuit 4b supplies the input potential Vi that is controlled to become equal to the reference voltage Vr to the internal circuit 2.

On the other hand, the power supply for test (not show in the figure) is connected to the power supply terminal 7 for test in the test mode. The power supply voltage Vd for test furnished by the power supply for test can be changed within the range of 0 to Vc. The output voltage of the mode determination control circuit 12 (i.e., the input voltage Vi applied to the voltage drop circuit 4b) exhibits different behavior according to whether the power supply voltage Vd is greater than the logical threshold voltage Vc/2 of the first-stage inverter 131 or not. When the power supply voltage Vd for test applied to the power supply terminal 7 for test is in the range of 0 to Vc/2 (i.e., 0 Vd Vc/2), the output of the first-stage inverter 131 is at a High level and the output of the next-stage inverter 132 is at a Low level, as can be seen from FIGS. 5(A) and 5(B). Therefore, the first transmission gate 141 whose input terminal is connected to the power supply terminal 7 for test is switched to its nonconducting state and the second transmission gate 142 whose input terminal is connected to the reference voltage generation circuit 4a is switched to its conducting state. Thus, the reference voltage Vr generated by the reference voltage generation circuit 4a is supplied to the voltage drop circuit 4b by way of the second transmission gate 142. The voltage drop circuit 4b then controls the external power supply voltage Vc so as to decrease it with the aim of making it equal to the reference voltage Vr, and supplies the decreased external power supply voltage to the internal circuit 2 as the input voltage Vi.

Thus, when the power supply voltage Vd for test is in the range of 0 Vd Vc/2, the input voltage Vi can be made to always agree with the reference voltage Vr. Therefore, the internal circuit 2 can be made to operate under the same condition as the normal operation mode while the semiconductor integrated circuitry is placed in the test mode. Therefore, whether the I/O circuit 3 can handle any change in the external power supply voltage Vc while having a margin up to which extent for the voltage change can be tested, and an evaluation of the operation limit can thus be made, by changing only the external power supply voltage Vc to be applied to the I/O circuit 3 while keeping the power supply voltage Vd for test applied to the internal circuit 2 within the range of 0 Vd Vc/2.

When the power supply voltage Vd for test in the range of Vc/2<Vd Vc is then applied to the power supply terminal 7 for test, the output of the first-stage inverter 131 makes a polarity inversion to a Low level and the output of the next-stage inverter 132 makes a polarity inversion to a High level, as can be seen from FIGS. 5(A) and 5(B). Therefore, the first transmission gate 141 whose input terminal is connected to the power supply terminal 7 for test is switched to its conducting state and the second transmission gate 142 whose input terminal is connected to the reference voltage generation circuit 4a is switched to its nonconducting state. As a result, the power supply voltage Vd for test applied to the power supply terminal 7 for test is supplied to the voltage drop circuit 4b by way of the first transmission gate 141. Since the voltage drop circuit 4b thus controls the external power supply voltage Vc so as to decrease it with the aim of making it equal to the power supply voltage Vd for test, the input voltage Vi can be made to always agree with the power supply voltage Vd for test when the power supply voltage Vd for test is in the range of Vc/2<Vd Vc, as can be seen from FIG. 4.

When the external power supply voltage Vc is 3.3 Volts and the reference voltage Vr is 2.5 Volts, as an example, if the power supply voltage Vd for test ranging from Vc/2 to Vc (i.e., from 1.65 Volts to 3.3 Volts) is applied to the power supply terminal 7 for test, the output of the mode determination control circuit 12, i.e., the input voltage Vi applied to the voltage drop circuit 4b varies from 1.65 Volts to 3.3 Volts. While the voltage applied to the voltage drop circuit 4b and the internal circuit 2 is fixed to 2.5 Volts in the normal operation mode, in the test mode the voltage can be increased by +0.8 Volts in an upward direction from 2.5 Volts, and also can be decreased by −0.85 Volts in a downward direction from 2.5 Volts. Thus, whether the internal circuit 2 can handle any change in the power supply voltage Vd for test while having a margin up to which extent for the voltage change can be tested, and an evaluation of the operation limit of the internal circuit 2 can thus be made properly, by changing only the power supply voltage Vd for test to be applied to the internal circuit 2 without changing the external power supply voltage Vc to be applied to the I/O circuit 3.

As mentioned above, in accordance with the first embodiment, without having to use a combination of the power supply terminal 7 for test and either a power supply switch circuit 5 or a power supply control terminal 8 as shown in FIG. 12, the semiconductor integrated circuitry can handle the test mode only by combining the power supply terminal 7 for test and the mode determination control circuit 12, thus integrating the functions of the power supply terminal for test and the power supply control terminal of the prior art semiconductor integrated circuitry into the power supply terminal 7 for test, and hence simplifying the circuit structure and improving the packaging density of the semiconductor integrated circuitry mounted on a circuit board. Furthermore, since the input voltage Vi can be made to always agree with the reference voltage Vr when the power supply voltage Vd for test is in the range of 0 Vd Vc/2, whether the I/O circuit 3 can handle any change in the external power supply voltage Vc while having a margin up to which extent for the voltage change can be tested, and an evaluation of the operation limit of the I/O circuit 3 can thus be made properly, by changing only the external power supply voltage Vc to be applied to the I/O circuit 3. On the other hand, since the input voltage Vi can be made to always agree with the power supply voltage Vd for test when the power supply voltage Vd for test is in the range of Vc/2<Vd Vc, whether the internal circuit 2 can handle any change in the power supply voltage Vd for test while having a margin up to which extent for the voltage change can be tested, and an evaluation of the operation limit of the internal circuit 2 can thus be made properly, by changing only the power supply voltage Vd for test without changing the external power supply voltage Vc. Furthermore, since each of the pair of inverters 131 and 132 is constructed of a pair of a P-channel transistor Qp and an N-channel transistor Qn as well as each of the pair of transmission gates 141 and 142, the mode determination unit 13 and the switching unit 14 can be easily implemented on the semiconductor integrated circuitry, thus ensuring a proper operation.

Embodiment 2

Semiconductor integrated circuitry 11 according to a second embodiment of the present invention has a first-stage inverter 131 whose operation characteristics are different from those of the first-stage inverter of the mode determination control circuit 12 of the semiconductor integrated circuitry according to the above-mentioned first embodiment. The semiconductor integrated circuitry 11 according to the second embodiment has a basic circuit structure that is the same as that of the semiconductor integrated circuitry according to the above-mentioned first embodiment. FIG. 6 is a graph showing an input voltage-output voltage characteristic of a mode determination control circuit of the semiconductor integrated circuitry according to the second embodiment of the present invention, and FIGS. 7(A) and 7(B) are graphs showing operation characteristics of the first-stage inverter included in the mode determination control circuit of the semiconductor integrated circuitry according to the second embodiment of the present invention. While the above-mentioned semiconductor integrated circuitry 11 according to the first embodiment of the present invention is so constructed that the output voltage of the mode determination control circuit 12 exhibits different behavior in the test mode according to whether the power supply voltage Vd for test is greater than Vc/2 or not, the semiconductor integrated circuitry 11 according to the second embodiment is so constructed that the output voltage of the mode determination control circuit 12 exhibits different behavior in the test mode according to whether the power supply voltage Vd for test is greater than Vc/3 or not. Concretely, a P-channel transistor Qp which constitutes the first-stage inverter 131 have driving efficiency different from that of an N-channel transistor Qn which also constitutes the first-stage inverter 131 such that the logical threshold voltage of the inverter 131 is decreased from Vc/2 to Vc/3.

In the first-stage inverter 131 located within the mode distinction control circuit 12, the driving efficiencies of the P-channel transistor Qp and the N-channel transistor Qn are different from each other, as mentioned above. The P-channel transistor Qp can be brought into conduction when a voltage applied between the gate and source of the P-channel transistor Qp exceeds a gate-source voltage that causes an electric current to begin to flow through the P-channel transistor Qp, i.e., a threshold voltage Vth(P). Similarly, the N-channel transistor Qn can be brought into conduction when a voltage applied between the gate and source of the N-channel transistor Qn exceeds a gate-source voltage that causes an electric current to begin to flow through the N-channel transistor Qn, i.e., a threshold voltage Vth(N). The absolute value of the driving efficiency of the P-channel transistor Qp is set to be larger than that of the N-channel transistor Qn, the driving efficiency of each transistor being represented by the rate of a change of the electric current I to a change of the gate voltage after each transistor is brought into conduction, Such the setting can be implemented by unequalizing the sizes of those transistors Qp and Qn, the lengths of their gates, the thicknesses of their gate oxide films, or the like. Therefore, the first-stage inverter 131 can be designed to have a threshold voltage of Vc/3 in such a manner that through the application of the threshold voltage the electric current I flowing through the P-channel transistor Qp which is measured as the gate voltage is increased is equal to the electric current I flowing through the N-channel transistor Qn which is measured as the gate voltage is decreased, so that the first-stage inverter 131 can be made to implement the desired inversion operation.

In the second embodiment, the output voltage of the mode determination control circuit 12 exhibits different behavior in the test mode according to the power supply voltage Vd for test is greater than the logical threshold voltage Vc/3 of the first-stage inverter131. When the power supply voltage Vd for test applied to the power supply terminal 7 for test is in the range of 0 Vd Vc/3, the output of the first-stage inverter 131 is at a High level and the output of the next-stage inverter 132 is at a Low level, as can be seen from FIGS. 7(A) and 7(B). Therefore, the second transmission gate 142 whose input terminal is connected to the reference voltage generation circuit 4a is switched to its conducting state, and, as shown in FIG. 6, the reference voltage Vr generated by the reference voltage generation circuit 4a is thus supplied to the voltage drop circuit 4b by way of the second transmission gate 142. When the power supply voltage Vd for test applied to the power supply terminal 7 for test is in the range of Vc/3<Vd Vc, the output of the first-stage inverter 131 makes a polarity inversion to a Low level and the output of the next-stage inverter 132 makes a polarity inversion to a High level, as can be seen from FIGS. 7(A) and 7(B). Therefore, the first transmission gate 141 whose input terminal is connected to the power supply terminal 7 for test is switched to its conducting state, and, as shown in FIG. 6, the power supply voltage Vd for test applied to the test power supply terminal 7 is thus supplied to the voltage drop circuit 4b by way of the first transmission gate 141.

When the external power supply voltage Vc is 3.3 Volts and the reference voltage Vr is 2.5 Volts, as an example, if the power supply voltage Vd for test ranging from Vc/3 to Vc (i.e., from 1.1 Volts to 3.3 Volts) is applied to the power supply terminal 7 for test, the output of the mode determination control circuit 12, i.e., the input voltage Vi applied to the voltage drop circuit 4b varies from 1.1 Volts to 3.3 Volts. While the voltage applied to the voltage drop circuit 4b and the internal circuit 2 is fixed to 2.5 Volts in the normal operation mode, in the test mode the voltage can be increased by +0.8 Volts in an upward direction from 2.5 Volts, and also can be decreased by −1.4 Volts in a downward direction from 2.5 Volts. Thus, whether the internal circuit 2 can handle any change in the power supply voltage Vd for test while having a margin up to which extent for the voltage change can be tested, and an evaluation of the operation limit of the internal circuit 2 can thus be made properly, by changing only the power supply voltage Vd for test to be applied to the internal circuit 2 without changing the external power supply voltage Vc to be applied to the I/O circuit 3.

As mentioned above, in accordance with the second embodiment, since the input voltage Vi can be made to always agree with the reference voltage Vr when the power supply voltage Vd for test is in the range of 0 Vd Vc/3, whether the I/O circuit 3 can handle any change in the external power supply voltage Vc while having a margin up to which extent for the voltage change can be tested, and an evaluation of the operation limit of the I/O circuit 3 can thus be made properly, by changing only the external power supply voltage Vc to be applied to the I/O circuit 3. On the other hand, since the input voltage Vi can be made to always agree with the power supply voltage Vd for test when the power supply voltage Vd for test is in the range of Vc/3<Vd Vc, whether the internal circuit 2 can handle any change in the power supply voltage Vd for test while having a margin up to which extent for the voltage change can be tested, and an evaluation of the operation limit of the internal circuit 2 can thus be made properly, by changing only the power supply voltage Vd for test without changing the external power supply voltage Vc.

Embodiment 3

Figure 8:
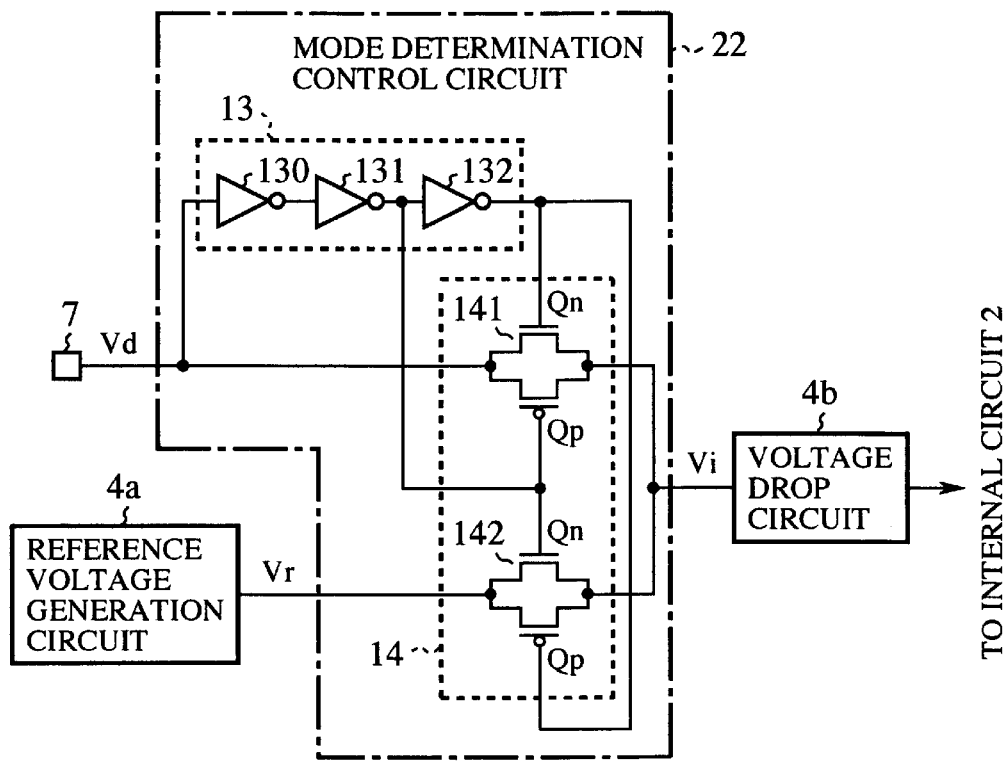
FIG. 8 is a schematic circuit diagram showing the structure of a main part of semiconductor integrated circuitry according to a third embodiment of the present invention.
Figure 9:
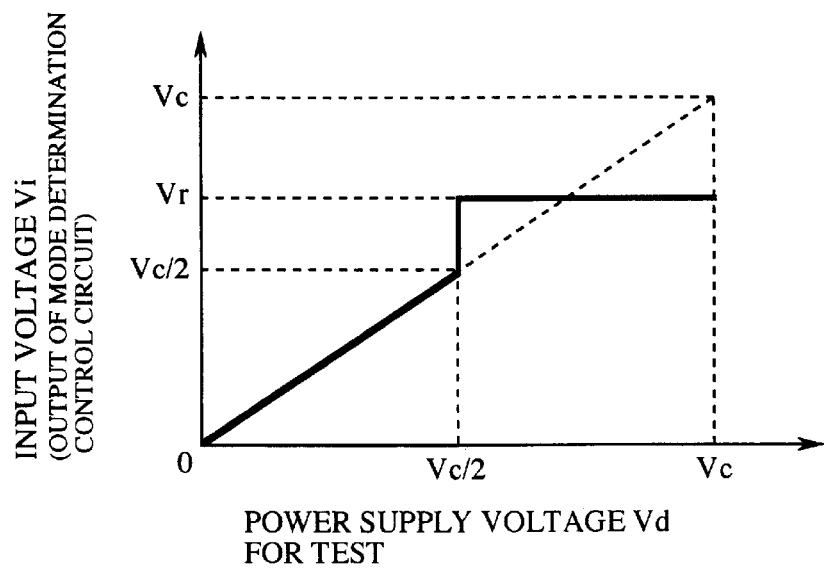
FIG. 9 is a graph showing an I/O voltage characteristic of a mode determination control circuit shown in FIG. 8.

FIG. 8 is a schematic circuit diagram showing the structure of a main part of semiconductor integrated circuitry according to a third embodiment of the present invention. In FIG. 8, the same components as of the first embodiment are designated by the same reference numerals as shown in FIG. 2, and therefore the description of those components will be omitted hereafter. In the third embodiment, a mode determination unit 13 disposed within a mode determination control circuit 22 is constructed of three inverters 130, 131 and 132 in series. In other words, the first-stage inverter 130 is newly disposed as the former stage of the series circuit constructed of the pair of inverters 131 and 132, which corresponds to the pair of inverters 130 and 131 of the first embodiment mentioned above. The logical threshold voltage of the first-stage inverter 130 is Vc/2.

In operation, the mode determination unit 13 according to the third embodiment performs a mode judgment operation according to a power supply voltage Vd for test applied thereto in the test mode in a way different to that of the first embodiment because of the addition of the first-stage inverter 130. The output voltage of the mode determination control circuit 22 exhibits different behavior, which is opposite to that shown by the output voltage of the mode determination control circuit of the first embodiment, according to whether the power supply voltage Vd for test is greater than the logical threshold voltage Vc/2 of the first-stage inverter 130 or not. When the power supply voltage Vd for test applied to a power supply terminal 7 for test is in the range of 0 Vd<Vc/2, the output of the first-stage inverter 130 is at a High level, the output of the second-stage inverter 131 is at a Low level, and the output of the third-stage inverter 132 is at a High level. Therefore, a first transmission gate 141 whose input terminal is connected to the power supply terminal 7 for test is switched to its conducting state, and the power supply voltage Vd for test is supplied to a voltage drop circuit 4b by way of the first transmission gate 141. When the power supply voltage Vd for test applied to the power supply terminal 7 for test is in the range of Vc/2 Vd Vc, the output of the first-stage inverter 130 makes a polarity inversion to a Low level, the output of the second-stage inverter 131 makes a polarity inversion to a High level, and the output of the third-stage inverter 132 makes a polarity inversion to a Low level. Therefore, a second transmission gate 142 whose input terminal is connected to a reference voltage generation circuit 4a is switched to its conducting state, and a reference voltage Vr generated by the reference voltage generation circuit 4a is supplied to the voltage drop circuit 4b by way of the second transmission gate 142.

When an external power supply voltage Vc applied to an external power supply terminal is 3.3 Volts and the reference voltage Vr is 2.5 Volts, as an example, if the power supply voltage Vd for test ranging from 0 to Vc/2 (i.e., from 0 Volts to 1.65 Volts) is applied to the power supply terminal 7 for test, the output of the mode determination control circuit 22, i.e., an input voltage Vi applied to an internal circuit 2 varies from 0 Volts to 1.65 Volts. While the voltage applied to the internal circuit 2 is fixed to 2.5 Volts in the normal operation mode, in the test mode the voltage can be decreased by −0.85 Volts to −2.5 Volts in a downward direction from 2.5 Volts and therefore various operation limit evaluation tests can be carried out at low-voltage levels.

As mentioned above, in accordance with the third embodiment, since the input voltage Vi can be made to always agree with the power supply voltage Vd for test when the power supply voltage Vd for test is in the range of 0 Vd<Vc/2, whether the internal circuit 2 can handle any change in the power supply voltage Vd for test while having a margin up to which extent for the voltage change can be tested, and an evaluation of the low-voltage operation limit of the internal circuit 2 can thus be made properly, by changing only the power supply voltage Vd for test without changing the external power supply voltage Vc. On the other hand, since the input voltage Vi can be made to always agree with the reference voltage Vr when the power supply voltage Vd for test is in the range of Vc/2 Vd Vc, whether the I/O circuit 3 can handle any change in the external power supply voltage Vc while having a margin up to which extent for the voltage change can be tested, and an evaluation of the operation limit of the I/O circuit 3 can thus be made properly, by changing only the external power supply voltage Vc to be applied to the I/O circuit 3.

Embodiment 4

Figure 10:
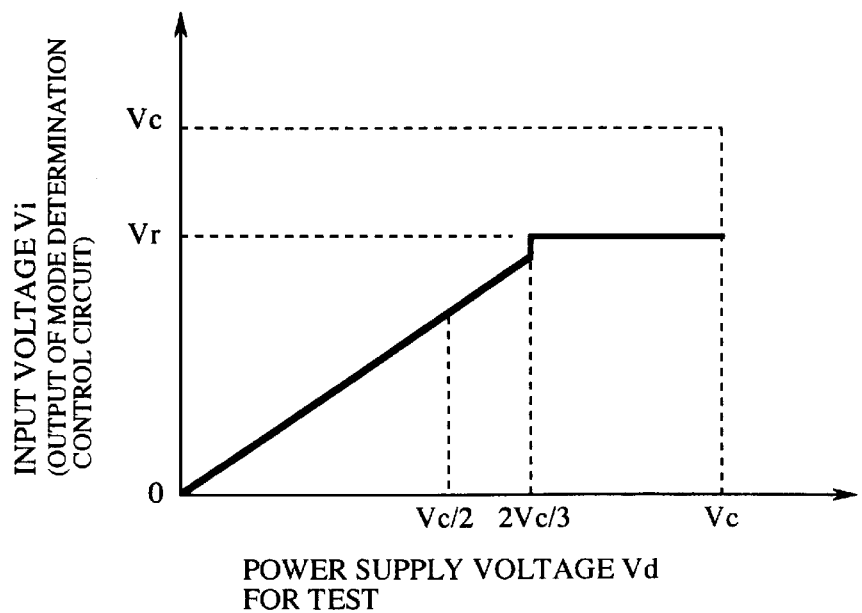
FIG. 10 is a graph showing an I/O voltage characteristic of a mode determination control circuit of semiconductor integrated circuitry according to a fourth embodiment of the present invention.

Semiconductor integrated circuitry 11 according to a fourth embodiment of the present invention has a first-stage inverter 130 located within a mode determination control circuit 22, having operation characteristics different from those of the first-stage inverter according to the above-mentioned third embodiment. The semiconductor integrated circuitry 11 according to the fourth embodiment has a basic circuit structure that is the same as that of the semiconductor integrated circuitry according to the above-mentioned third embodiment. FIG. 10 is a graph showing an input voltage-output voltage characteristic of the mode determination control circuit of the semiconductor integrated circuitry according to the fourth embodiment of the present invention. Although the above-mentioned semiconductor integrated circuitry 11 according to the third embodiment is so constructed that the output voltage of the mode determination control circuit 22 exhibits different behavior in the test mode according to whether the power supply voltage Vd for test is greater than Vc/2 or not, the semiconductor integrated circuitry 11 according to the fourth embodiment is so constructed that the output voltage of the mode determination control circuit 22 exhibits different behavior in the test mode according to whether the power supply voltage Vd for test is greater than 2Vc/3 or not. Concretely, a P-channel transistor Qp which constitutes the first-stage inverter 130 is so constructed as to have driving efficiency different from that of an N-channel transistor Qn which also constitutes the first-stage inverter 130 such that the logical threshold voltage of the first-stage inverter 130 is increased from Vc/2 to 2Vc/3.

In the fourth embodiment, the output voltage of the mode determination control circuit 22 exhibits different behavior in the test mode according to the power supply voltage Vd for test is greater than the logical threshold voltage 2Vc/3 of the first-stage inverter 130. When the power supply voltage Vd for test applied to a power supply terminal 7 for test is in the range of 0 Vd<2Vc/3, the output of the first-stage inverter 130 is at a Low level, the output of a second-stage inverter 131 is at a High level, and the output of a third-stage inverter 132 is at a Low level. Therefore, a first transmission gate 141 whose input terminal is connected to the power supply terminal 7 for test is switched to its conducting state, and, as shown in FIG. 10, the power supply voltage Vd for test applied to the power supply terminal 7 for test is supplied to a voltage drop circuit 4b by way of the first transmission gate 141. When the power supply voltage Vd for test applied to the power supply terminal 7 for test is in the range of 2Vc/3 Vd Vc, the output of the first-stage inverter 130 makes a polarity inversion to a High level, the output of the second-stage inverter 131 makes a polarity inversion to a Low level, and the output of the third-stage inverter 132 makes a polarity inversion to a High level.

Therefore, a second transmission gate 142 whose input terminal is connected to a reference voltage generation circuit 4a is switched to its conducting state, and, as shown in FIG. 10, a reference voltage Vr furnished by the reference voltage generation circuit 4a is supplied to the voltage drop circuit 4b by way of the second transmission gate 142.

When an external power supply voltage Vc applied to an external power supply terminal is 3.3 Volts and the reference voltage Vr is 2.5 Volts, as an example, if the power supply voltage Vd for test ranging from 0 to 2Vc/3 (i.e., from 0 Volts to 2.2 Volts) is applied to the power supply terminal 7 for test, the output of the mode determination control circuit 22, i.e., a voltage applied to an internal circuit 2 varies from 0 Volts to 2.2 Volts. While the voltage applied to the internal circuit 2 is fixed to 2.5 Volts in the normal operation mode, in the test mode the voltage can be decreased by −0.2 Volts to −2.5 Volts in a downward direction from 2.5 Volts and various tests can thus be carried out in a wide voltage range.

As mentioned above, in accordance with the fourth embodiment, since the input voltage Vi can be made to always agree with the power supply voltage Vd for test when the power supply voltage Vd for test is in the range of 0 Vd<2Vc/3, whether the internal circuit 2 can handle any change in the power supply voltage Vd for test while having a margin up to which extent for the voltage change can be tested, and an evaluation of the low-voltage operation limit of the internal circuit 2 can thus be made properly, by changing only the power supply voltage Vd for test without changing the external power supply voltage Vc. On the other hand, since the input voltage Vi can be made to always agree with the reference voltage Vr when the power supply voltage Vd for test is in the range of 2Vc/3 Vd Vc, whether the I/O circuit 3 can handle any change in the external power supply voltage Vc while having a margin up to which extent for the voltage change can be tested, and an evaluation of the operation limit of the I/O circuit 3 can thus be made properly, by changing only the external power supply voltage Vc to be applied to the I/O circuit 3.

Embodiment 5

Figure 11:
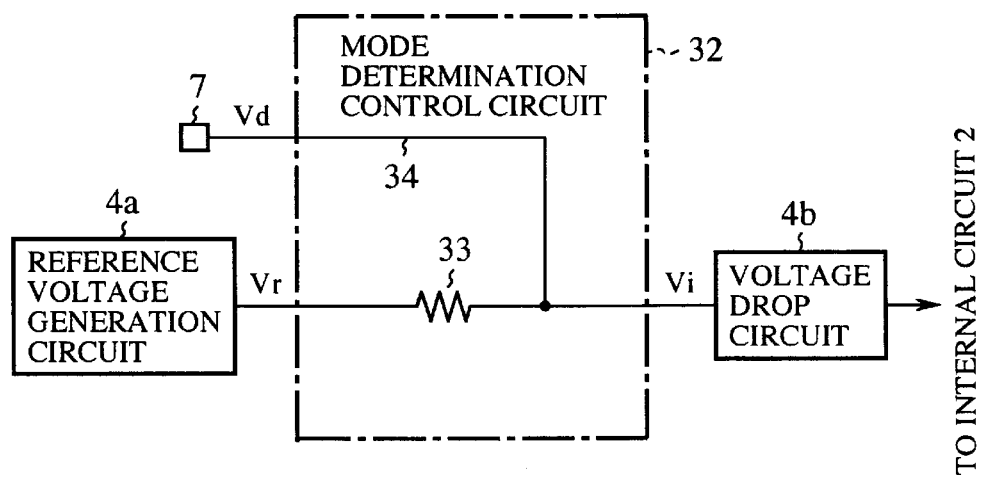
FIG. 11 is a schematic circuit diagram showing the structure of a main part of semiconductor integrated circuitry according to a fifth embodiment of the present invention.

FIG. 11 is a schematic circuit diagram showing the structure of a main part of semiconductor integrated circuitry according to a fifth embodiment of the present invention. In the figure, reference numeral 32 denotes a mode determination control circuit, numeral 33 denotes a resistor located within the mode determination control circuit 32, which connects a reference voltage generation circuit 4a to a voltage drop circuit 4b, and numeral 34 denotes a power supply voltage supply line for test for connecting a power supply terminal 7 for test to a node located between the resistor 33 and the voltage drop circuit 4b.

In operation, since a power supply for test is not connected to the power supply terminal 7 for test in the normal operation mode, the voltage drop circuit 4b receives a reference voltage Vr generated by the reference voltage generation circuit 4a by way of the resistor 33. In this case, since the input impedance of the voltage drop circuit 4b is high, the electric current which flows in the resistor 33 or voltage drop in the resistor 33 is so small that it may be ignored. Therefore, the voltage drop circuit 4b can control an external power supply voltage Vc applied thereto via an external power supply terminal so as to decrease it with the aim of making it equal to the reference voltage Vr generated by the reference voltage generation circuit 4a. On the other hand, in the test mode the power supply for test is connected to the power supply terminal 7 for test, and the output voltage of the mode determination control circuit 32 (i.e., an input voltage Vi applied to the voltage drop circuit 4 b) is almost ruled by the power supply voltage Vd for test. This is apparent from the fact that the output voltage of the mode determination control circuit 32 has a value obtained by dividing the power supply voltage Vd for test and the reference voltage Vr by the resistance of the power supply voltage supply line 34 for test and the resistance of the resistor 33, and the resistance of the power supply voltage supply line 34 for test can be ignored compared with the resistance of the resistor 33.

As mentioned above, in accordance with the fifth embodiment, since the mode determination control circuit 32 can be constructed of only the resistor 33 and the power supply voltage supply line 34 for test, the circuit structure can be simplified and the packaging density of the semiconductor integrated circuitry can be increased greatly. However, in the normal operation mode in which the power supply terminal 7 for test is placed in a state wherein no power supply is connected, there is a case where the reference voltage Vr become unstable because of a noise which comes from the power supply terminal 7 for test. Furthermore, when various tests are carried out in the test mode while changing the power supply voltage Vd for test, since the reference voltage Vr supplied from the reference voltage generation circuit 4 by way of the resistor 33 collides with the power supply voltage Vd for test in the mode determination control circuit 32, it is preferable for users to use the semiconductor integrated circuitry at the risk of difficulty in performing strict voltage management and achieving test results according to a test intention.

Many widely different embodiments of the present invention may be constructed without departing from the spirit and scope of the present invention. It should be understood that the present invention is not limited to the specific embodiments described in the specification, except as defined in the appended claims.

What is claimed is:

1. Semiconductor integrated circuitry comprising:
   an internal circuit that is an semiconductor integrated circuit;
   an I/O circuit for activating an input/output of said internal circuit in response to an external power supply voltage applied thereto;
   a reference voltage generation circuit for decreasing said external power supply voltage so as to generate a constant reference voltage;
   a voltage drop circuit for controlling said external power supply voltage so as to decrease it such that it is equal to an input voltage applied thereto, and for supplying the decreased external power supply voltage to said internal circuit; and
   a mode determination control circuit to which a power supply voltage for test is supplied from a power supply for test that is connected to a power supply terminal for test in test mode, for comparing the power supply voltage for test with a threshold voltage so as to determine whether said semiconductor integrated circuitry is placed in either normal operation mode or the test mode, and for supplying either the reference voltage or the power supply voltage for test to said voltage drop circuit as the input voltage according to the mode determination result.

2. The semiconductor integrated circuitry according to claim 1, wherein said mode determination control circuit includes a mode determination means having a pair of inverters in series having an input terminal for receiving the power supply voltage for test, and a switching means having a pair of transmission gates, for selectively supplying either the reference voltage or the power supply voltage for test to said voltage drop circuit, said pair of transmission gates having output terminals connected in common to said voltage drop circuit, one of the transmission gates having an input terminal connected to the power supply terminal for test and the other transmission gate having an input terminal connected to said reference voltage generation circuit, and only one of said pair of transmission gates being switched to its conducting state in response to two outputs of the inverters included in said inverter pair.

3. The semiconductor integrated circuitry according to claim 2, wherein a first-stage one of said pair of inverters inverts its output voltage based on a logical threshold voltage that is equal to or less than one-half of the external power supply voltage.

4. The semiconductor integrated circuitry according to claim 1, wherein said mode determination control circuit includes a mode determination means having three inverters in series having an input terminal for receiving the power supply voltage for test, and a switching means having a pair of transmission gates, for selectively supplying either the reference voltage or the power supply voltage for test to said voltage drop circuit, said pair of transmission gates having output terminals connected in common to said voltage drop circuit, one of the transmission gates having an input terminal connected to the power supply terminal for test and the other transmission gate having an input terminal connected to said reference voltage generation circuit, and only one of said pair of transmission gates being switched to its conducting state in response to two outputs of two of said three inverters in series other than a first-stage one of them.

5. The semiconductor integrated circuitry according to claim 4, wherein a first-stage one of said three inverters in series inverts its output voltage based on a logical threshold voltage that is equal to or greater than one-half of the external power supply voltage.

6. The semiconductor integrated circuitry according to claim 1, wherein said mode determination control circuit includes a resistor located on a line for connecting said reference voltage generation circuit to said voltage drop circuit, and a power supply voltage supply line for test for supplying the power supply voltage for test to a node located between said resistor and said voltage drop circuit.

* * * * *